(12) United States Patent
Tomita et al.

(10) Patent No.: US 6,914,703 B2
(45) Date of Patent: Jul. 5, 2005

(54) HOLOGRAPHIC RECORDING MATERIAL COMPOSITION

(75) Inventors: Yasuo Tomita, 31-9, Edaminami 3-chome, Tsuzuki-ku, Yokohama-shi, Kanagawa (JP); Naoaki Suzuki, Chofu (JP)

(73) Assignees: Yasuo Tomita, Yokohama (JP); Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/807,279

(22) Filed: Mar. 24, 2004

(65) Prior Publication Data

US 2005/0068594 A1 Mar. 31, 2005

(30) Foreign Application Priority Data

Sep. 26, 2003 (JP) ........................................ 2003-335493

(51) Int. Cl.[7] .................................................. G03H 1/02
(52) U.S. Cl. .............................................. 359/3; 430/1
(58) Field of Search .............................. 359/3; 430/1–2

(56) References Cited

U.S. PATENT DOCUMENTS

| | | | |
|---|---|---|---|
| 5,453,340 A | 9/1995 | Kawabata et al. | |
| 5,759,721 A | 6/1998 | Dhal et al. | |
| 6,236,493 B1 | 5/2001 | Schmidt et al. | |
| 6,479,193 B1 | * 11/2002 | Maeda et al. | 430/1 |
| 2002/0110740 A1 | 8/2002 | Otaki et al. | |
| 2004/0096776 A1 | * 5/2004 | Tanigawa et al. | 430/281.1 |

FOREIGN PATENT DOCUMENTS

| JP | A 2003-84651 | 3/2003 |
|---|---|---|
| JP | 2003-084651 | * 3/2003 |

OTHER PUBLICATIONS

Suzuki et al. "Holographic Recording in $TiO_2$ Nanoparticle–Dispersed Methacrylate Photopolymer Films," Applied Physics Letters, vol. 81, No. 22, Nov. 25, 2002.

* cited by examiner

*Primary Examiner*—Leonidas Boutsikaris
(74) *Attorney, Agent, or Firm*—Oliff & Berridge, PLC

(57) ABSTRACT

A holographic recording material composition used for storing optical information as a spatial variation of refractive index, having: (a) a compound having at least one polymerizable functional group; (b) a photopolymerization initiator; and (c) colloidal silica particles having an average particle diameter of from 4 to 30 nm.

6 Claims, 2 Drawing Sheets

HOLOGRAPHIC RECORDING MATERIAL COMPOSITION

BACKGROUND OF THE INVENTION

1. Field of the Art

The present invention relates to a novel holographic recording material composition capable of recording a volume phase hologram.

2. Description of the Related Art

A hologram is known as a pattern of refractive index or absorptance recorded on a photosensitive material, and has been used in a broad range of optical elements, a stereographic display, interference measurement and recording or processing of images or information as it has multiple functions.

As conventional and representative material compositions for holographic recording, gelatin dichromate photosensitive material or silver salt photosensitive material subjected to bleaching process has been used. Although these materials have high diffraction efficiencies, there are disadvantages that they require complicated processes for producing a hologram, in particular a wet development process.

As a dry photosensitive material for hologram by which the above-mentioned disadvantages are overcome, the products of OmniDex (trademark; manufactured by E.I. du Pont de Nemours, Inc.) are commercially available. The material contains a radical polymerization monomer and a binder polymer, a photo-radical polymerization initiator and a sensitizing pigment as main components, and records a hologram by utilizing the difference of refractive indices between the radical polymerization monomer and the binder polymer. Specifically, when the photosensitive material formed in a shape of film is subjected to interference exposure, radical polymerization is initiated at an area where light is strongly irradiated, and in accordance with it, a concentration gradient of the radical polymerization monomer is made, and the concentration gradient causes the diffusion of the radical polymerization monomer from areas where light is weakly irradiated to areas where light is strongly irradiated. As a result of it, low and high portions in density of radical polymerization monomer and density of polymerized polymer are made, and a hologram is formed as a variation of the refractive indices among the above-mentioned monomer, polymer and binder polymer. Although the material system has the best performance as a photopolymer for hologram reported at present, applications are limited to a thickness of the order of 20 $\mu$m, and it is pointed out that the material has problems in heat resistance and transparency.

U.S. Pat. No. 5,453,340 or U.S. Pat. No. 5,665,494 (these related patent: JP-A-5-107999) discloses a material system in which radical polymerization and cationic polymerization are simultaneously used. U.S. Pat. No. 5,759,721 discloses a material system in which cationic polymerization used. However, these materials are composed of only organic materials, and thus problems on mechanical strength or environmental stability have not fully been elucidated yet.

In addition, U.S. Pat. No. 6,479,193 or U.S. Pat. No. 6,524,771 (these related patents: JP-A-6-019040 and JP-A-6-148880) discloses a material system in which an inorganic material network and a photopolymerizable monomer are simultaneously used. In a case where an inorganic material capable of forming a network is used as a binder, there are advantages that it is excellent in heat resistance, environmental resistance and mechanical strength, and it can enlarge the difference of refractive indices between the binder and the photopolymerizable organic monomer. However, the hologram recording film formed from the material system has problems that it is relatively brittle, and is not good in flexibility, processability or coating performance, and that it is difficult to prepare a homogeneous coating material as the compatibility of the inorganic binder with the organic monomer is not good.

Further, U.S. Pat. No. 6,236,493 (related patent: JP-A-2000-508783) discloses a material in which super fine metal particles are dispersed into a solid matrix. However, the invention disclosed therein has problems that it is requested to confer fluidity upon the matrix and is not good in solid performance.

In addition, U.S. patent application Ser. No. 2002/0110740 (related patent JP-A-2002-236440) discloses a holographic recording material in which an organic-inorganic hybrid polymer and organic metal fine particles having photopolymerization reactive groups are used. However, the invention disclosed therein has a problem as an industrial process as it requires heating and UV polymerization for fixing interference fringes.

As a material for making hologram recording in a simpler manner, JP-A-2003-84651 or N. Suzuki, Y. Tomita, and T. Kojima (Appl. Phys. Lett., 2002, Vol. 81, p. 4121–4123) discloses a holographic recording material in which inorganic fine particles are dispersed into photopolymerizable monomers. However, the invention disclosed therein has a problem that it has a large light scattering as the fine particles have a large particle diameter and broad particle size distribution.

SUMMARY OF THE INVENTION

An object of the present invention is to provide a holographic recording material composition capable of permanently forming a hologram having a low light scattering loss and high diffraction efficiency.

As a result of an eager research, the present inventors found that a homogeneous dispersion of a silica sol (a stable dispersion of colloidal silica particles having an average particle diameter of from 4 to 30 nm.) and a photopolymerization initiator into a polymerizable compound provides a holographic recording material composition in which a hologram having an extremely lowered light scattering loss and high diffraction efficiency can be formed by a brief light irradiation, and completed the present invention.

That is, the present invention relates to a holographic recording material composition used for storing optical information as a spatial variation of refractive index, comprising:

(a) a compound having at least one polymerizable functional group;
(b) a photopolymerization initiator, and
(c) colloidal silica particles having an average particle diameter of from 4 to 30 nm.

According to the present invention, a holographic recording material composition and a holographic recording medium having a low light scattering loss and high diffraction efficiency can be provided by dispersing homogeneously colloidal silica particles into polymerizable monomers The present composition has multi functions and therefore is applicable in a wide areas for optical elements, a stereographic display, interference measurement and recording or processing of images or information.

DESCRIPTION OF THE PREFERRED EMBODIMENTS

Figure 1:
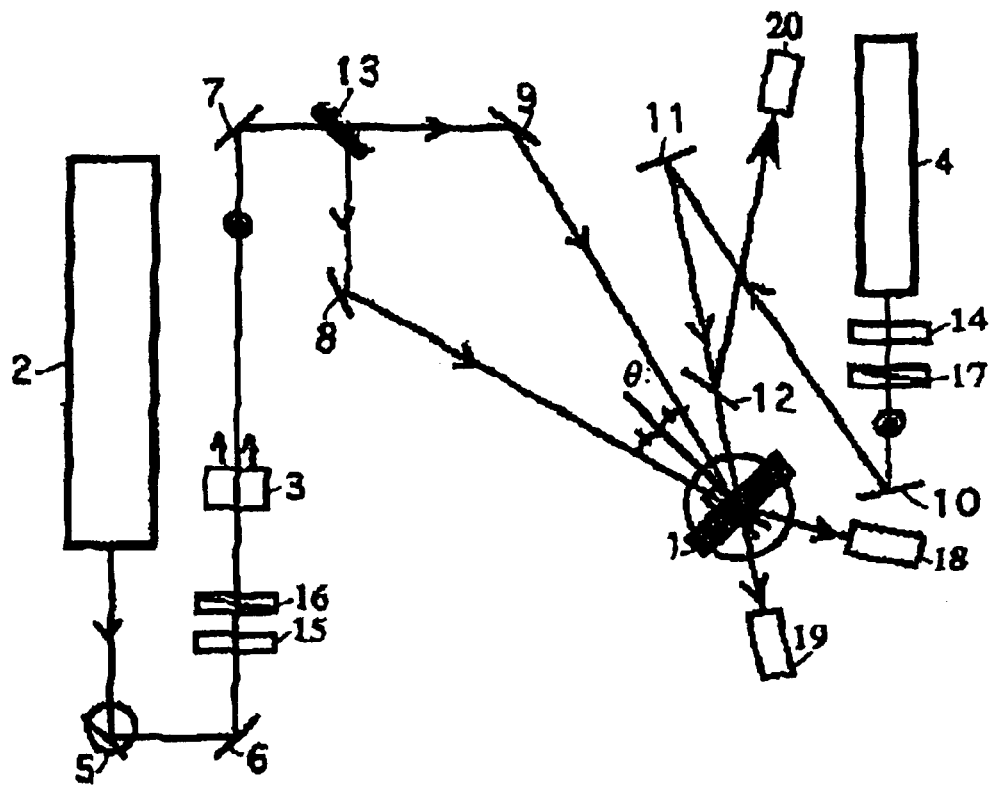
FIG. 1 is a schematic diagram showing two-beam interference exposure on a recording medium: a holographic recording medium (1), an Nd:YVO$_4$ laser (2), a beam expander (3), a He—Ne laser (4), a mirror (5, 6, 8, 9, 10, 11), a beam sampler (12), a half mirror (13), a half-wave plate (14, 15), a polarizing prism (16, 17), a photo-detector (18, 19)

Hereinafter, the present invention is described in detail.

The holographic recording material composition of the present invention comprises (a) a compound having at least one polymerizable functional group (hereinafter referred to as a polymerizable monomer); (b) a photopolymerization initiator for initiating the polymerization of the component (a); and (c) colloidal silica particles having an average particle diameter of from 4 to 30 nm.

The present invention can provide a holographic recording material composition from which a hologram having the high diffraction efficiency is formed by dispersing colloidal particles into polymerizable monomers and thereby making the difference of refractive indices between a region corresponding to the light part of the interference fringes and a region corresponding to the dark part thereof large.

Next, a process for hologram recording of the medium by using the holographic recording material composition according to the present invention can provide a volume phase hologram is described. First of all, simultaneous irradiation of coherent laser light on a medium creates interference fringes in which light parts and dark parts are aligned in a periodic structure. Then, the polymerizable monomers start to polymerize In the light parts, and the concentration of the polymerizable monomers in the light part is lowered. Thereby, a concentration gradient of the polymerizable monomers between the dark part and the light part appears, the polymerizable monomers migrate and are supplied from the dark part to the light part, and then the polymerization further progresses in the light part. On the other hand, it is assumed that the colloidal silica particles migrate from the light part to the dark part with the migration of the polymerizable monomers.

Further, after a certain amount of time lapses, the polymerization of polymerizable monomers finally progresses also in the dark part, and consequently the whole recording layer of the medium becomes polymers. As mentioned above, there is formed the periodic distribution with difference of relative densities between the polymerizable monomers and colloidal silica in the polymer of the polymerizable monomers. As the refractive index of the silica particles differs from that of the polymerizable monomers in a polymerized state, the distribution of the refractive indices is formed on the recording layer and thus a hologram is recorded thereon. On reconstruction, when a light for reconstruction is irradiated on the region where the hologram is formed, the diffraction occurs, and then the hologram image is reconstructed.

Hereinafter, the constitution of the holographic recording material composition according to the present invention is described in detail.

The polymerizable monomer is a compound having a refractive index of from 1.5 to 2.0, and contains, for example an ethylenically unsaturated compound. The ethylenically unsaturated compound is a compound undergoing addition polymerization by the action of a photopolymerization initiator, or in some cases a compound having in the molecule at least one radical polymerizable and ethylenically unsaturated bond so as to undergo crosslinking and curing. In the meantime, functional compounds in the present invention mean an opposite concept to that of so-called polymers, therefore include strictly monomers, and also dimers, trimers and oligomers. Preferably, the refractive index of the polymerizable monomers is 1.6 or more.

The functional monomer having an ethylene type unsaturated bond includes, for example an unsaturated carboxylic add, an ester of a aliphatic polyhydroxy compound with an unsaturated carboxylic acid; an ester of an aromatic polyhydroxy compound with an unsaturated carboxylic acid; an ester obtained by an esterification reaction of an unsaturated carboxylic acid and polyvalent carboxylic acid with a polyvalent hydroxy compound, such as the above-mentioned aliphatic polyhydroxy compound and aromatic polyhydroxy compound, etc.

Concrete examples of the above-mentioned ester of an aliphatic polyhydroxy compound with an unsaturated carboxylic acid are acrylates, such as ethylene glycol diacrylate, triethylene glycol diacrylate, trimethylol propane triacrylate, trimethylol ethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, glycerol acrylate or the like, methacrylates in which the acrylic acid in the acrylate is replaced by methacrylic acid, itaconates in which the acrylic acid in the acrylate is replaced by itaconic acid, similarly crotonates in which the acrylic acid in the acrylate is replaced by crotonic acid, or maleates in which the acrylic acid in the acrylate is replaced by maleic acid, to which the present invention is not limited.

The ester of an aromatic polyhydroxy compound with an unsaturated carboxylic acid includes hydroquinone diacrylate, hydroquinone dimethacrylate, resorcine diacrylate, resorcine dimethacrylate, pyrogallol triacrylate, or the like. The ester obtained by an esterification reaction of an unsaturated carboxylic acid and polyvalent carboxylic acid with a polyvalent hydroxy compound is not necessarily a single compound, and the representative concrete examples thereof include a condensation product of acrylic acid, phthalic acid and ethylene glycol, a condensation product of acrylic acid, maleic acid and diethylene glycol, a condensation product of methacrylic acid, terephthalic acid and pentaerythritol, a condensation product of acrylic acid, adipic acid, butanediol and glycerin, etc.

Besides the above-mentioned ester (meth)acrylates, so-called urethane (meth)acrylates or epoxy (meth)acrylates can be used. The former can be produced by addition reaction of a polyvalent isocyanate with a hydroxy acrylate, and the latter can be produced by addition reaction of a polyvalent epoxy compound with a hydroxy acrylate.

Other useful examples of the ethylene type unsaturated compounds are acrylamides, such as ethylene bisacrylamide; allyl esters, such as diallyl phthalate; vinyl group containing compounds, such as divinyl phthalate. In the present invention, among the ethylenically unsaturated compounds, monomers of acrylic ester or methacrylic ester are particularly preferable.

Respective functional monomers may be used alone or in a mixture thereof as appropriate. The polymerization initiator includes a cationic polymerization initiator, etc. and a particularly preferable initiator is a photo-radical polymerization initiator. The photo-radical polymerization initiator generates active radicals by a light for a first exposure for producing a hologram.

The radical polymerization initiator is not limited if it acts as a polymerization initiator for a polymerizable monomer, and includes, for example azo compounds, azide compounds, organic peroxides, onium salts, bisimidazole derivatives, titanocene compounds, iodonium salts, organic thiol compounds, derivatives of hydrocarbon halides, etc. Among them, titanocene compounds are preferable.

The titanocene compounds are not specifically limited, and concretely includes dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,6-difluorophen-1-yl, dicyclopentadienyl-Ti-bis-2,6-difluoro-3-(pyr-1-yl)-phen-1-yl, etc.

The average particle diameter of the colloidal silica particles is preferably 30 nm or less. This is because too large average particle diameter is liable to cause significant light scattering. The diameter is more preferably 20 nm or less. Although it is preferable that the silica particles have smaller average particle diameter, the practical lower limit thereof is 4 nm as it is difficult to produce particles having too small diameter. The average particle diameter D (nm) of the colloidal silica is a particle diameter converted as a spherical particle calculated from specific surface area S ($m^3/g$). Conversion equation: $D=2720/S$ is generally used. The estimation of the specific surface area is carried out by nitrogen adsorption method (BET method) in the region of an average diameter of 8 nm or more, and by Sears' titration method in the region of an average diameter less than 8 nm.

The refractive index modulation in the holographic recording material composition is determined by the sum of products of the volume ratio of the constitution components and the refractive index. Although the migrating amount of the polymerizable monomers is an important element in order to increase the refractive index modulation, there is an upper limit in the amount of silica particles that can be dispersed in the composition, and thus too much amount of silica particles becomes difficult to be dispersed therein. Taking the above into consideration, it is preferable that the proportion of the silica particles in the total volume of the silica particles and resin components in a polymerized state is 3 to 60 vol %, and that the optimum value for affording the maximum modulation of refractive indices ranges generally from approximately 30 to 50 vol %. The resin components mean polymerizable monomers, for example. When the holographic recording material composition contains binder resins, the resin components mean the polymerizable monomers and the binder resins.

The colloidal silica particles are used as a silica sol in which the particles are dispersed in water or an organic solvent, in order to make the particles dispersed homogeneously in the polymerizable monomers. The organic solvent is for example methanol, isopropanol, butanol, ethylene glycol, ethylene glycol-monopropyl ether, methyl ethyl ketone, methyl isobutyl ketone, xylene, dimethyl acetamide or toluene. The organic solvent is not specifically limited so long as it can be dispersed homogeneously in the polymerizable monomers.

The recording layer in the holographic recording medium according to the present invention can optionally contain a sensitizing agent, a chain transfer agent, a plasticizer, a colorant or the like, in addition to the above mentioned components (a) to (c). Further, in order to impart a uniformity of the coating thickness and to stabilize a hologram formed by polymerization with light irradiation, a binder resin may be added as a binding agent.

As the binder resin, a compound having a good compatibility with the functional monomer is preferable, concrete examples are a chlorinated polyethylene, polymethyl methacrylate, a copolymer of methyl methacrylate with other alkyl (meth)acrylate, a copolymer of vinyl chloride with acrylonitrile, polyvinyl acetate, polyvinyl alcohol, polyvinyl formal, polyvinyl butyral, polyvinyl pyrrolidone, ethyl cellulose, acetyl cellulose, etc.

When a holographic recording medium is produced by using the holographic recording material composition according to the present invention, a polymerizable monomer, a photopolymerization initiator and a colloidal silica are mixed with a sensitizing agent and a binder resin if necessary, to obtain a mixture, and the resulting mixture in a state without any solvent is applied on a transparent substrate, or a solution obtained by mixing the mixture with a solvent or an additive is applied on a substrate, thereafter dried to form a recording layer. Further, another transparent substrate or a protective layer for blocking oxygen may be provided on the recording layer.

The transparent substrate includes a transparent glass sheet, an acrylic sheet, a polyethylene terephthalate film, polyethylene film, etc. A transparent resin film includes a polyethylene terephthalate film, polyethylene film, etc. An application method includes a method for directly adding dropwise, and conventional known methods, for example spin coating, wire-bar coating, dip coating, air-knife coating, roller coating, blade coating or curtain coating.

As the protective layer, there can be used technique known for preventing adverse effects, such as a lowering in sensitivity due to oxygen or deterioration of shelf stability, for example coating of water soluble polymer. In the present invention, water-soluble polymer for forming a transparent resin film may be used.

EXAMPLES

Hereinafter, the present invention is described more specifically on the basis of examples.

Example 1 Measurement of the Diffraction Efficiency

Ten gram (10.0 g) of silica sol (dispersed in methyl isobutyl ketone, 30 mass %) was added dropwise with stirring in a solution prepared by dissolving 0.032 g of Irgacure 784 (trademark; a photopolymerization initiator; manufactured by Ciba Specialty Chemicals) in 3.16 g of polymerizable monomer (A) (p-bis(β-methacryloyloxy ethylthio)xylylene, and dispersed homogeneously therein.

The colloidal silica particles in the silica sol used had an average particle diameter of 13 nm (BET method).

The colloidal silica particles and the polymerizable monomer (A) in a polymerized state had refractive indices of 1.46 and 1.59, respectively, and thus the difference of the both refractive indices was 0.13. The silica particle had a density of 2.1 g/cm$^3$, and thus the volume thereof was 2.73/2.1=1.30 cm$^3$. The polymerizable monomer (A) in a polymerized state had a density of 1.25 g/cm$^3$, and thus the volume thereof was 3.16/1.25=2.53 cm$^3$. Therefore, the proportion of the silica particle in the total volume of the silica particle and polymerizable monomer (A) in a polymerized state was 1.30/(1.30+2.53)=0.34, that is, 34 vol %.

A polyethylene terephthalate film having a thickness of 50 μm was applied as spacer on both ends of a slide glass, the above mentioned mixture was added dropwise on the center portion of the slide glass (a region interposed between the spacers), and it was dried in an oven at 80° C. for about 30 minutes to form a recording layer. Thereafter, the recording layer was covered with a slide glass to prepare a holographic recording medium having a film thickness of about 46 μm.

It was tried to carry out holographic recording on the medium with two-beam interference exposure by using the apparatus shown in FIG. 1. Medium 1 was subjected to the two-beam interference exposure at a exposure power density of 100 mW/cm$^2$ with Nd:YVO$_4$ laser at a wavelength of 532 nm. The light emitted from the Nd:YVO$_4$ laser was split into two beams by a half mirror after passing a beam expander, and respective beams were irradiated on the medium 1 after passing a mirror and interference fringes of both beams were recorded thereon to form a hologram.

Figure 2:
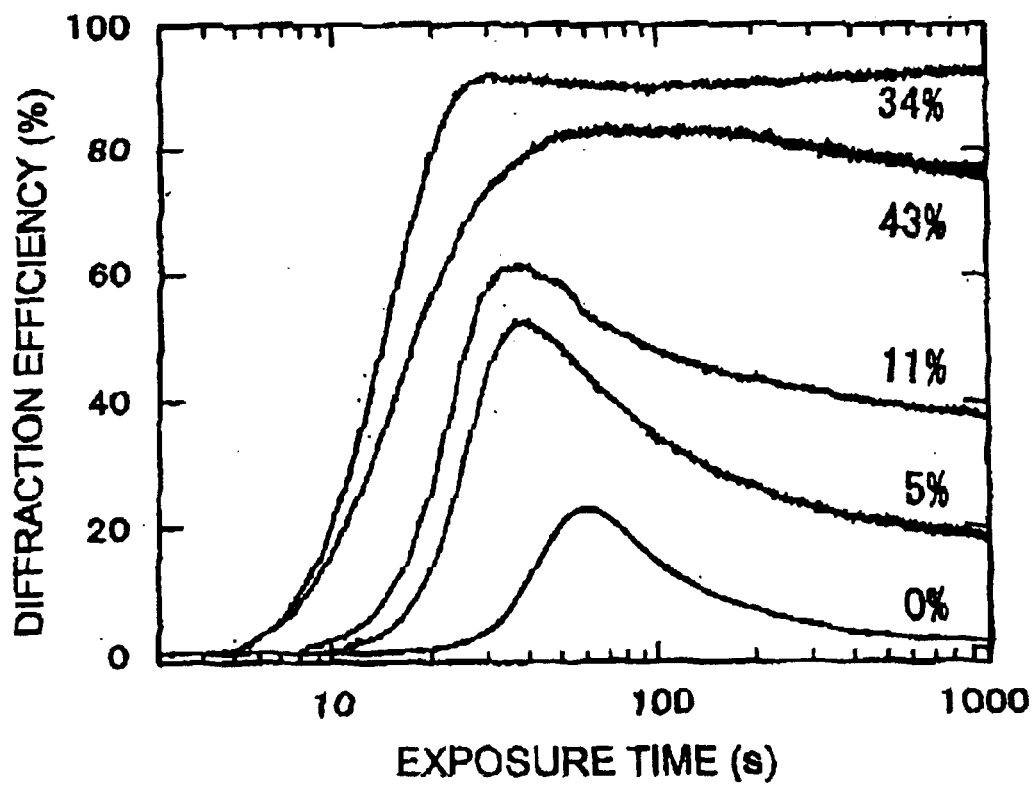
FIG. 2 is a graph showing changes of the diffraction efficiency with the lapse of exposure time in the recording media of Examples 1 to 4 and Comparative Example 1.

Simultaneously, the hologram forming process was traced by irradiating a helium neon laser having a wavelength of 632.8 nm for which the medium 1 is not sensitive, and detecting diffraction light by a photo detector. As mentioned above, the diffraction efficiency was evaluated. FIG. 2 is a graph showing changes of the diffraction efficiency of the present sample with the elapse of time. The diffraction efficiency rose sharply, reached to 80% after about 20 seconds, and thereafter was also maintained in a high level. That is, it was confirmed that a hologram having the diffraction efficiency of almost 100% could be permanently formed.

Example 2 (Measurement of the Diffraction Efficiency)

A sample having a volume fraction of colloidal silica particles: 43% was prepared in a similar manner as that of Example 1, and the diffraction efficiency of the sample was evaluated.

Example 3 (Measurement of the Diffraction Efficiency)

A sample having a volume fraction of colloidal silica particles: 11% was prepared in a similar manner as that of Example 1, and the diffraction efficiency of the sample was evaluated.

Example 4 (Measurement of the Diffraction Efficiency)

A sample having a volume fraction of colloidal silica particles: 5% was prepared in a similar manner as that of Example 1, and the diffraction efficiency of the sample was evaluated.

Example 5 (Measurement of Scattering Loss)

Figure 4:
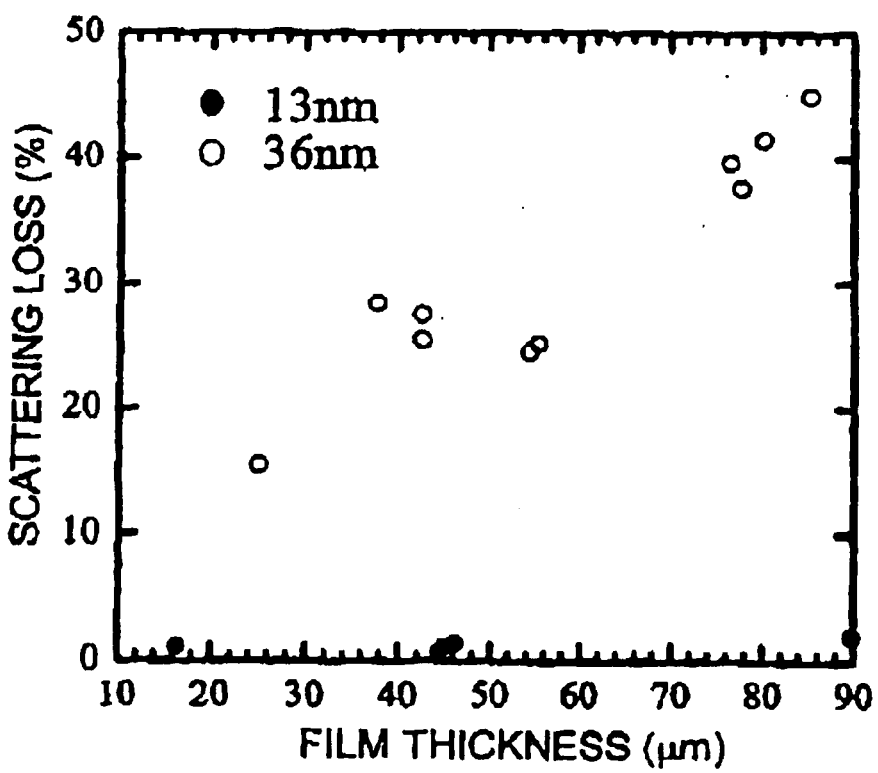
FIG. 4 is a graph showing a film-thickness dependency of scattering loss in the recording medium of Example 5.

A sample having a volume fraction of colloidal silica particles: 34% and an average particle diameter of 36 nm (BET method) or 13 nm (BET method) that was prepared in a similar manner as that of Example 1 was subjected to the measurements of film thickness dependency. As a result of it, the sample having a film thickness of ca. 40 μm and an average particle diameter of 36 nm showed a light scattering of 22±2%, while the sample having an average particle diameter of 13 nm showed a light scattering of 1.3±2% that was reduced to 1/7 compared to that having an average particle diameter of 36 nm (see, FIG. 4).

Comparative Example 1

A holographic recording medium was prepared in a similar manner as that of Example 1 except that colloidal silica particles were not added. Holographic recording was carried out on the recording medium with two-beam interference exposure by using the apparatus shown in FIG. 1. FIG. 2 is a graph showing changes of the diffraction efficiency of the present sample with the elapse of time. Although the diffraction efficiency rose temporarily, it fell with the elapse of time, and finally, it almost disappeared. This corresponds to that the modulation of refractive indices disappears when the whole of functional monomers being single component is polymerized (see, FIGS. 2 and 3).

Comparative Example 2

Figure 3:
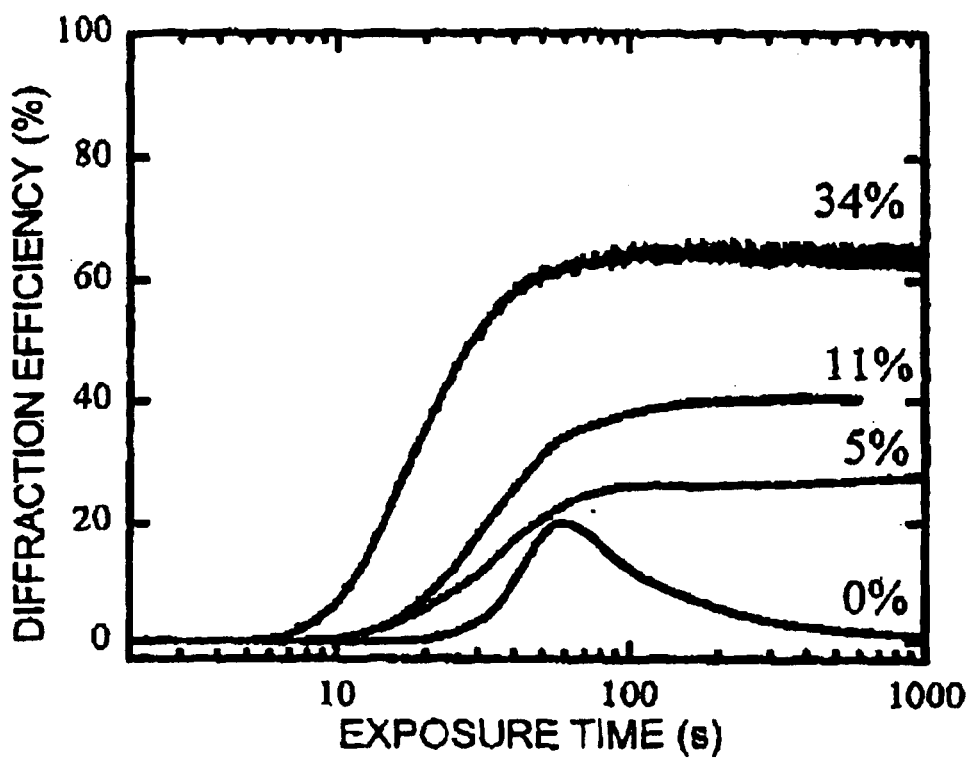
FIG. 3 is a graph showing changes of the diffraction efficiency with the lapse of exposure time in the recording media of Comparative Examples 1 and 2.

Samples containing a silica sol (dispersed in toluene, 5, 11 or 34 mass %) having an average particle diameter of 36 nm and a sample containing no silica sol were prepared, and the diffraction efficiencies thereof were measured (see, FIG. 3).

What is claimed is:

1. A holographic recording material composition used for storing optical information as a spatial variation of refractive index, comprising:
   (a) a compound having at least one polymerizable functional group;
   (b) a photopolymerization initiator, and
   (c) a silica sol being a stable dispersion of colloidal silica particles having an average particle diameter of from 4 to 30 nm.

2. The holographic recording material composition according to claim 1, wherein the compound having at least one polymerizable functional group has a refractive index of from 1.5 to 2.0.

3. The holographic recording material composition according to claim 1, wherein the colloidal silica particles are contained in an amount of from 3 to 60 vol % based on the total volume of the colloidal silica particles and resin components in a state of polymerization.

4. A holographic recording medium comprising the composition as defined in claim 1.

5. A holographic recording medium having a photosensitive layer for recording comprising the composition as defined in claim 1 on a transparent substrate, and the photosensitive layer covered with a protective material.

6. The holographic recording medium according to claim 5, wherein the transparent substrate and the protective material are made of transparent resin films.

* * * * *